United States Patent [19]

Fukuyo

[11] 4,167,686
[45] Sep. 11, 1979

[54] MINIATURIZED AT-CUT PIEZOELECTRIC CRYSTAL RESONATOR

[76] Inventor: Hitohiro Fukuyo, 19-2, Yoyogi 2-chome, Shibuya-ku, Tokyo, Japan

[21] Appl. No.: 875,040

[22] Filed: Feb. 3, 1978

Related U.S. Application Data

[63] Continuation-in-part of Ser. No. 700,237, Jun. 28, 1976, abandoned, which is a continuation of Ser. No. 535,745, Dec. 23, 1974, abandoned.

[30] Foreign Application Priority Data

Dec. 21, 1973 [JP] Japan ................................ 48-142422

[51] Int. Cl.$^2$ ............................................ H01L 41/18
[52] U.S. Cl. ..................................... 310/361; 310/367; 310/368
[58] Field of Search ............... 310/361, 320, 368, 369, 310/367

[56] References Cited

U.S. PATENT DOCUMENTS

| | | | |
|---|---|---|---|
| 3,792,294 | 2/1974 | Royer | 310/361 |
| 4,017,753 | 4/1977 | Ishiwata et al. | 310/368 |
| 4,071,797 | 1/1978 | Zumsteg et al. | 310/361 |
| 4,114,062 | 9/1978 | Mattuschka | 310/368 X |

*Primary Examiner*—Mark O. Budd
*Attorney, Agent, or Firm*—Sughrue, Rothwell, Mion, Zinn and Macpeak

[57] ABSTRACT

An AT-cut piezoelectric crystal resonator having a plurality of contoured surfaces, two of these contoured surfaces being generated by translating contour lines parallel to the z-axis and perpendicular to the electric axis. At least one of these two surfaces is convex, and another two contoured surfaces are perpendicular to the z-axis and spaced apart by a length dimension $z'_0$ which is 0.1 to 1.3 of the maximum thickness dimension representing the distance between the first mentioned two surfaces and measured along a line perpendicular to the x-axis. The resonator is adapted for performing a mode of vibration along the thickness forming either a fundamental standing wave or an overtone thereof of a thickness-shear vibration. The free ends of the vibration are positioned at the first mentioned two surfaces, and the amplitude of vibratory displacements appearing along the x-axis is maximum at the center of each surface of the first mentioned two surfaces. The last mentioned center is the midpoint of a length taken along the x-axis dimension which is 3 to 15 of the maximum thickness dimension, and constituting the span of arc of the convex surface. The amplitude becomes null at a point on each of the first mentioned two surfaces where that point approaches each end of the convex line generating the convex surface, and the distribution of the amplitude is uniform on any point taken along the length of the above mentioned z-axis dimension on each of the first mentioned two surfaces.

12 Claims, 11 Drawing Figures

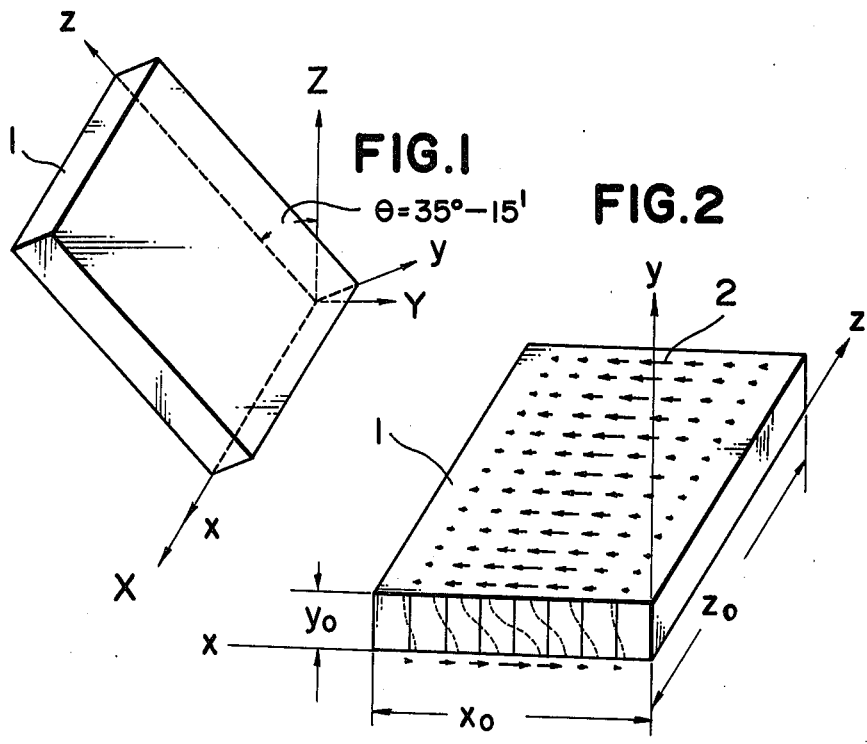
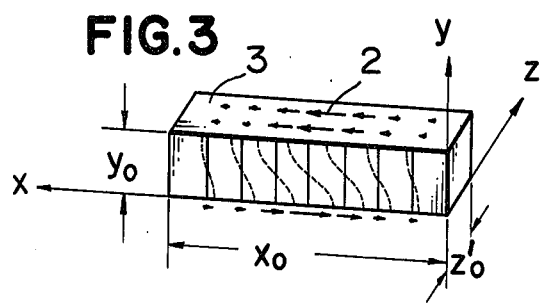
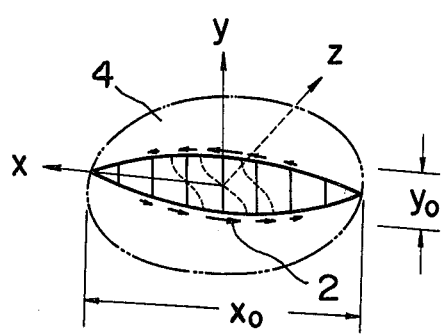
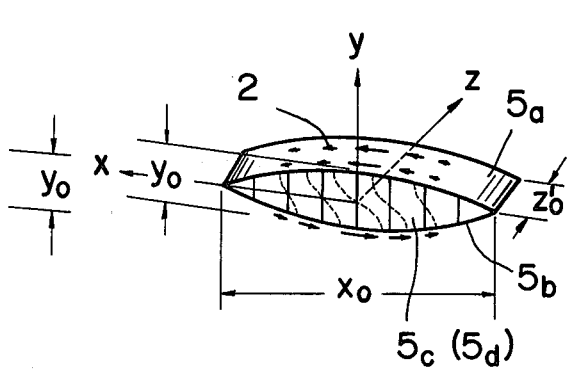

MINIATURIZED AT-CUT PIEZOELECTRIC CRYSTAL RESONATOR

CROSS-REFERENCE TO RELATED APPLICATIONS

The present application is a continuation-in-part of Ser. No. 700,237 filed June 28, 1976, which is, in turn, a continuation of Ser. No. 535,745 filed Dec. 23, 1974 both now abandoned with benefit of Convention right from Japanese patent application No. 142,422/1973 filed originally Dec. 21, 1973 in Japan.

BACKGROUND OF THE INVENTION

This invention relates in general to piezoelectric crystal resonators for use either in an electric oscillator or in an electric filter; and more particularly, it relates to AT-cut or $R_1$-cut piezoelectric crystal resonators of extremely small overall dimensions.

As is well known, the AT-cut crystal resonator is most efficient and superior among known various type of resonators. With recent advancement of technology, it has been endevored towards miniaturized At-cut crystal resonators. In this respect, James J. Royer has made profound experiments and studies (refer to his thesis entitled "A New DT Quartz Resonator" and published in "IEEE-Transactions on Sonics and Ultrasonics", Vol. SU - 17, No. 1, January 1970).

Royer concludes that when the AT-cut resonator is reduced gradually in its Z'-axis dimension according to his definition, it operates at last substantially as a DT-cut one. He proposes the length to dimension of width (Y' according to his definition) must be larger than 20, and the plano-length $l_1$ between the bevels must be 30–60% of the length of the resonator. Even with satisfaction of such dimensional requirements, however, Q amounts only to 50,000–100,000. In addition, fired silver counter weights as mass loadings must be provided at the both ends of the resonator plate, in order to supress anharmonics, thereby reducing unwanted spurious oscillations. The most interesting subject of the Royer's resonator is its frequency-temperature curve in the form of DT-characteristic one which is demonstrated on page 22 of his thesis. This curve is similar to the DT-characteristic curve shown on page 29 of "Quartz Crystals for Electrical Circuits", second edition, authored by R. A. Heising and published by D. Van Nostrand Company, Inc., New York. It is thus seen that the frequency-temperature curve of Royer's resonator is far from the AT-curve in the form of cubic one, as demonstrated on the same page 29 of the Heising's publication. My invention aims at the realization of an ideal AT-curve as mentioned above, of highly miniaturized AT-cut crystal resonator without accompanying unwanted spurious reponses.

SUMMARY OF THE INVENTION

An object of this invention is to provide a highly miniaturized AT-cut piezoelectric crystal resonator having frequency-temperature characteristics as favorable as in the conventional large size AT-cut piezoelectric crystal resonators of the date.

A further object is to provide a highly miniaturized AT-cut piezoelectric crystal resonator which is easy to drive electrically and easy to mount in position.

A still further object of this invention is to provide a miniaturized At-cut piezoelectric crystal resonator, the dimension along the z-axis of which is so small that the said resonator is easily driven electrically through the z-axis perpendicular to the electric axis as well as the y-axis or axis of thickness.

It is a still another object of this invention to provide an improved AT-cut crystal resonator rather easily applicable to the mass production line.

A further object of the invention is to provide a highly miniatured piezoelectric AT-cut crystal resonator operable with a high Q-value even in the order of 1,000,000.

A still further object is to provide of the improved resonator of the above kind and operable with a highly stable frequency over a broad range of temperature.

A further object is to provide the improved resonator of the above kind and having a favorable aging effect and without accompanying unfavorable spurious vibration effect.

Upon execution of a large number of practical experiments and upon my profound theoretical analysis of the AT-cut crystal resonator, I adopt such resonator type as having a plurality of contoured surfaces, two of said contoured surfaces being generated by translating contour lines parallel to the z-axis and perpendicular to the electric axis or x-axis, at least one of the said two surfaces being convex, and another two contoured surfaces being perpendicular to said z-axis, since this resonator type provides highly superior and more favorable characteristics over prior art resonators.

The most important feature of the invention resides in that the said parallel surfaces are spaced apart by a length dimension $z'_0$ which is 0.1 to 1.3, preferably 0.3 to 1.0, of the maximum thickness dimension $y_0$ representing the distance between the first said two surfaces and measured along a line perpendicular to the said x-axis. The resonator is adapted for performing a mode of vibration along the said thickness forming either a fundamental standing wave or an overtone thereof of a thickness-shear vibration, the free ends of said vibration being positioned at the first said two surfaces.

The amplitude of vibratory displacements appearing along said x-axis is maximum at the center of each surface of the first said two surfaces, the said center being the midpoint of a length taken along the said x-axis or the dimension $x_0$ which is 3 to 15 of the maximum thickness dimension $y_o$, as a second important feature and constituting the span of arc of the said convex surface.

The amplitude becomes null at a point on each of the first said two surfaces where the said point approaches each end of the convex line generating said convex surface, and the distribution of the said amplitude being uniform on any point taken along the said length of the said $z'_0$ dimension on each of the first said two surfaces, thereby assuring the desired AT-cut characteristics.

These and further objects, features and advantages of this invention will become more apparent in the following detailed description of the invention to be set forth in connection with the accompanying drawings wherein:

BRIEF DESCRIPTION OF THE DRAWINGS

FIG. 1 is a perspective view of a conventional rectangular flat surface AT-cut piezoelectric crystal resonator, indicating the relation between the contours of the resonator and the axes of rectangular co-ordinates which are X, Y, Z and x, y, z, respectively.

FIG. 2 is a perspective view of an ordinary rectangular flat surface AT-cut piezoelectric crystal resonator of the conventional type, indicating a mode of the main thickness-shear vibration thereof.

FIG. 3 is a perspective view of a crystal resonator, indicating a mode of the main thickness-shear vibration basic to this invention; a contour-dimension perpendicular to the direction of the electric axis of the crystal resonator such as shown in FIG. 2, having been shortened, however, to the same order of dimension of the thickness of the crystal resonator.

FIG. 4 is a perspective view of a circular bi-convex AT-cut piezoelectric crystal resonator of the conventional design, indicating a mode of the main thickness-shear vibration of the resonator.

FIG. 5 is a perspective view of an embodiment of an AT-cut piezoelectric crystal resonator of this invention, illustrating its vibration mode.

DETAILED DESCRIPTION OF THE INVENTION

Figure 6:
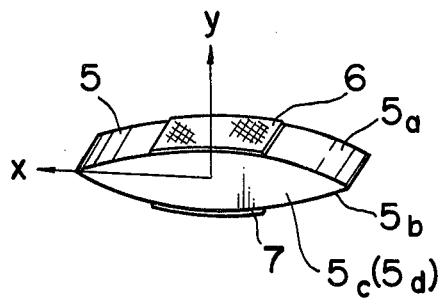
FIG. 6 is a perspective view of the resonator shown in FIG. 5, indicating a mode of attachment of driving electrodes for drive thereof.

Before entering into detailed description of several preferred embodiments of the present invention, a brief explanation of a representative conventional rectangular flat surface AT-cut piezoelectric quartz crystal resonator will be given by reference to FIGS. 1 and 2 for better understanding of the invention.

In the conventional resonator shown at 1 in FIG. 1., the axes of the rectangular co-ordinates are shown by X, Y and Z, while the contour axes of the resonator are denoted by x, y and z, wherein the axes X and x are kept in coincidence with each other wherein x-axis represents the electrical axis of the quartz.

As is generally well known, the vibration of an AT-cut crystal resonator comprises a main thickness-shear vibration and a plurality of spurious vibrations, the later comprising in turn "inharmonic" thickness-shear vibrations, higher order shear flexure vibrations and higher order overtone contour vibrations along x- and z-axes, as shown in FIGS. 1 and 2.

The mode of vibration shown in FIG. 2 is obtained only in a resonator having one or other of carefully selected general shapes which can be designed by reliance of a value relating to a series of periodical cycles to be accorded with the contour dimensions, so as to make the spurious vibrations substantially decoupled with the main thickness-shear vibration.

According to the theoretical and experimental studies of myself and others, the standing wave of the thickness shear vibration will appear along the thickness of the resonator as at $y_0$ and the resulting alternate displacements of the material thereof will appear in the direction of the z-axis, as schematically represented by a number of small arrows shown in FIG. 2. These displacements are sensed at the upper and lower x-z surfaces of the resonator 1, the said both surfaces including the free ends of vibration whereat the co-ordinates x, y and z correspond to certain specific values, $x_0$, $y_0$ and $z_0$, respectively.

The distribution of the alternate displacements on each of the both surfaces of the plate resonator may be represented by a half cycle of a continuous sine wave curve and shows its maximum value at the center point of the co-ordinate length $x_0$, although the said distribution provides a certain constant value through the end point corresponding to the co-ordinate $x_0$ along the z-axis.

From the observation set forth hereinabove, it may be seen that the vibrating elastic wave does not propagate along the z-axis, but it does in the x–y section.

This means that the resonance frequency or the mode of the main thickness-shear vibration of a rectangular flat surface AT-cut crystal resonator is not concerned with the dimension of $z_0$, if a plate resonator is sliced along a x-y plane with a proper consideration to avoid harmful coupling effects of the main thickness-shear vibration with spurious vibrations. Accordingly, there will be no change in the resonance frequency and vibration mode, even if the dimension $z_0$ of the resonator 1 of FIG. 2 is shortened in its width up to the order of $y_0$. A very small dimension $z'_0$ of the resonator 3 in FIG. 3 is obtained in this way. Consequently, the dimension of an AT-cut crystal resonator can be miniaturized by such way and without losing its favorable frequency-temperature characteristics. However, conventional supporting means for such resonator of FIGS. 2-3 become rather difficult to fit properly, and, therefore, it is necessary to apply a contouring to the x-z surfaces. Such a contouring technique may be similar to that as adopted in the formation of a convex surfaced AT-cut crystal resonator 4 which can be supported firmly at its sharply tapered edges without disturbing the thickness-shear vibration mode.

In FIG. 4, origin of the co-ordinates (x, y, z) is set at the center of gravity of the resonator 4.

As will be explained later herein in connection with FIG. 8, the thickness-shear standing wave of the resonator 4 is fundamentally the same as those of the resonators shown in FIG. 2 and FIG. 3.

The amplitude of the alternate displacements corresponding to those at 2 on the chief surfaces 5a; 5b of the resonator 4 will become maximum at the center of the length $x_0$ taken along the x-axis, although the distribution is slightly different from that of the foregoing resonator 1 or 3.

At the resonator 4, the magnitude of the amplitude of vibration taken along the x-axis decreases rapidly as the thickness along the y-axis decreases. The said amplitude becomes zero at the peripheral edges of the resonator. The above tendency of the magnitude along x-axis is applicable to the consideration of distribution of the amplitudes along the z-axis.

According to my theoretical and experimental studies with respect to this vibration mode of the resonator 4, the fundamental elastic wave which yields the standing wave of the main thickness-shear vibration propagates only within x–y section, although the distributions of the vibration along x- and z-axes on the surfaces of the resonator 4 can be regarded as slightly different from those of the rectangular surface resonator 1, as it being based on the fact that the contour of the resonator 4 is rounded and its x–z surface is bi-convex.

FIG. 5 shows one preferred practical embodiment of the present invention, illustrating a further miniaturized AT-cut crystal resonator 5 which is designed by consideration of the beneficial characteristics of the thickness-shear vibration of the AT-cut crystal resonators shown in FIGS. 2, 3 and 4. As indicated, the upper and lower chief surfaces $5a$; $5b$ of the resonator 5 are represented by a combination of two convex-contoured surfaces which are generated by translating contour lines parallel to the z-axis.

In FIG. 5, the maximum thickness is set to $y_0$ taken along the y-axis, the contour dimension of length is $x_0$ taken along the x-axis and the contour dimension of width is $z'_0$ taken along the z-axis whose value is almost the same as $y_0$ as illustrated. Upon synthesizing the above-mentioned theoretical and experimental studies, the mode of the main thickness-shear vibration of the resonator 5 is as follows: In the y-axis, the standing wave of the thickness-shear vibration is formed; in the x-axis, the amplitude of the displacement as at 2 on the contoured chief surfaces $5a$; $5b$ becomes maximum at the center of the length $x_0$ corresponding to the span of arc of each of the convex surfaces and practically null at the both edges of the peripheries; and in the z-axis, the amplitude of the displacement as at 2 is kept uniform for every value z, along the z-axis, since the shape of the x–y section surrounded by two contoured surfaces does not change as has been explained with reference to the rectangular x–y section as shown in FIGS. 2 and 3. Auxiliary surfaces $5c$ and $5d$ are perpendicular to the z-axis, the distance therebetween being $z'_0$.

Before this invention, no one could elucidate, either theoretically or experimentally, the above described vibration mode of this invention. Some explanations were given to the conventional AT-cut piezoelectric crystal resonators by neglecting the contour dimension along the z-axis entirely. However, these were not related to the above mode of vibration proposed by this invention. According to this invention, the dimension of the resonator along the z-axis is actively taken into consideration theoretically and experimentally, and it is revealed that the dimension $z_0$ can be minimized to $z'_0$ which may be a tenth or larger of the maximum thickness $y_0$ of the resonator as at 5. Thus, the ratio of $z'_0$ to $y_0$ may be 0.1–1.3, preferably 0.3–1.0. The reason for this dimensional requirement will be set forth hereinafter with reference to FIG. 11.

In the embodiment shown in FIG. 5, the ratio $x_0/y_0$ may be set to 3–15. If this ratio be less than 3, the convex curve will become too much acute to be practically manufactured. Thus, on account of technical difficulty, such acute resonator can not be provided. On the other hand, when the ratio exceeds 15, the contour shear mode of vibration becomes remarkable and affects the thickness shear-shear mode. Thus, the ideal characteristic free from spurious oscillation can not be obtained.

As the modes of vibration along the x-axis in the resonators 4 and 5 are similar to each other fundamentally, the latter resonator 5 can be supported firmly at the both peripheral edges of $x_0$ in the similar way as the former resonator 4 of FIG. 4.

Figure 8:
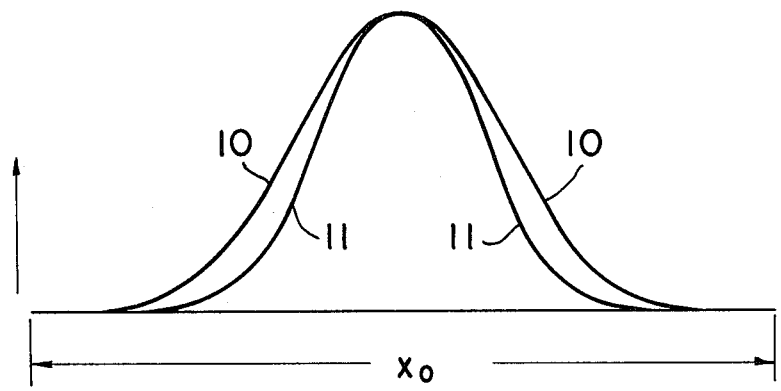
FIG. 8 represents two displacement-contour dimension curves as met in a main thickness-shear vibration of the resonator shown in FIG. 4, one of the said curves being obtained by the theoretical calculation and the other being obtained by practical experimental results, wherein, however, the scales are arbitrary.

FIG. 8 shows two curves 10 and 11. These two curves are obtained from the study on the resonator 4 only schematically shwon in FIG. 4.

The curve 10 represents theoretical results calculated in the study with respect to the distribution of the alternate displacements of the main thickness-shear vibration taken along the x-axis of the resonator 4. The curve 11 represents experimental results also obtained along the x-axis. As illustrated in FIG. 8, the curve 11 which indicates the experimental results agrees well with the theoretically calculated curve 10, and therefore, similar kind of agreement between the theory and experiment will easily be deduced for the type of resonator shown in FIG. 5.

Figure 7:
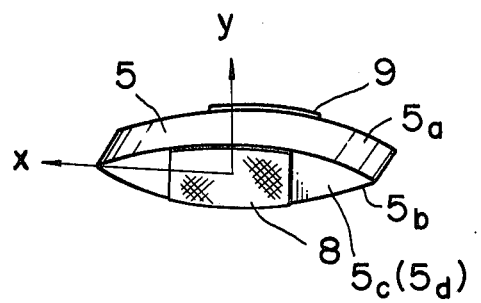
FIG. 7 is a similar view to FIG. 6, illustrative of a further different arrangement of drive electrodes attached to the same resonator.

FIGS. 6 and 7 show two complete embodiments of the crystal resonator unit of the present invention comprising the same resonator element as in FIG. 5 on which two electrodes 6 and 7 or 8 and 9 are firmly attached by sputtering, printing or the like fixing technique, in order to drive its thickness-shear vibration. In the former embodiment of this invention, shown in FIG. 6, the electrodes 6 and 7 are put on the contoured chief surfaces of the resonator 5 and in the latter embodiment, shown in FIG. 7, the electrodes 8 and 9 are put onto the auxiliary surfaces $5c$ and $5d$ which are not directly concerned with the vibration of the resonator element 5.

It is a well known fact that the Y-axis component of the electric field yields a stress within the resonator piezoelectrically. Since the dimension of the contour $z'_0$ is almost the same as the dimension of the maximum thickness $y_0$, sufficient values of the Y-axis component of the electric field can also be given by the electrodes 8 and 9, and accordingly, the resonator 5 of FIG. 7 can be driven by these electrodes in the similar way as in the case of FIG. 6 in which the resonator 5 is driven by the electrodes 6 and 7. This result could not be obtained with use of the conventional AT-cut crystal resonator of the prior art before this invention.

In the conventional AT-cut crystal resonator 1, the electric field appearing along the y-axis which may be produced by a pair of drive electrodes of the conventional type will yield a sufficient value of Y-component which is strong enough to drive the resonator because of its smaller value of $y_0$ in comparison to other contour dimensions. It is, however, not applicable to the electric field appearing along the z-axis of which component along the Y-axis is not sufficient enough to drive the resonator 1 by and through the type of the electrodes such as those shown as an example in FIG. 7, as the dimension $z_0$ of the resonator 1 is too much larger than the dimension $y_0$ so that it is impossible to yield a sufficient Y-component enough to drive the resonator piezoelectrically.

In the present invention, however, the dimension $z'_0$ taken along the z-axis is so shortened that the electric field along the z-axis is sufficient enough to yield the effective field intensity for driving the resonator 5.

Figure 9:
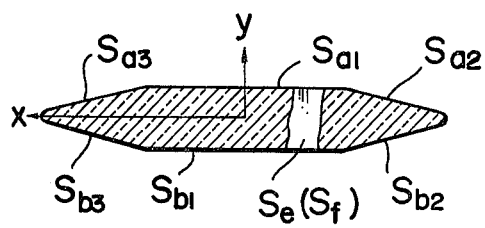
FIGS. 9 and 10 are substantially sectional elevations viewed along the z-axis of the still another types of AT-cut piezoelectric crystal resonators according to this invention.

The embodiment shown in FIG. 9 corresponds to a modification from the foregoing resonator 5 and represents a flat level surface $S_{a1}$ or $S_{b1}$ and two neighboring inclined surfaces $S_{a2}$; $S_{a3}$ or $S_{b2}$; $S_{b3}$, providing in combination a chief surface in place of the contoured chief surface $5a$ or $5b$. Auxiliary surfaces are shown at $S_e$ and $S_f$, respectively. The operational mode is similar to that of the foregoing element shown in FIG. 6 or 7. In the further modification shown in FIG. 10, the upper chief surface comprises a central horizontal level one $S_{cl}$ and two neighboring inclined surfaces $S_{c2}$ and $S_{c3}$ which correspond to those described above at $S_{a1}$; $S_{a2}$ and $S_{a3}$, respectively. The remaining chief surface $S_d$ is comprised by the flat base surface at $S_d$. Auxiliary surfaces $S_g$ and $S_h$ are perpendicular to the z-axis as in the foregoing modification in FIG. 9. The operation is similar as before.

Figure 11:
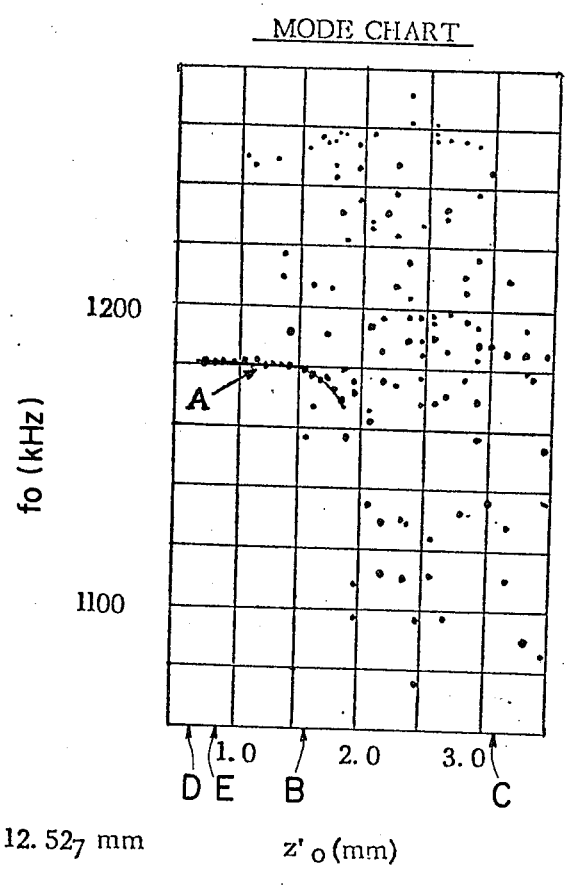
FIG. 11 is a mode chart, indicating the frequency distribution with variation of the dimension of $z_0$ and containing a great many number of dotts each indicating the observed strength of oscillation of a resonator of a specific dimension of $z_0'$.

As a reference and for the explanation of the particularities of my invention effectively, I have made a series of experiments by observing the modes of vibrations of the AT-cut resonators in detail which results are illustrated in FIG. 11 of the accompanying drawing showing the mode chart.

In this mode chart indicating the frequency distribution with vibration of the dimension of $z_0'$ is shown which contains a great many number of dotts each indicating the observed strength of oscillation of a resonator of a specific dimension of $z_0'$. The dimensions of $x_0 = 12.527$ mm and $y_0 = 1.529$ mm for all resonators concernd in the mode chart. In the chart, the smaller dotts indicate weaker oscillations while larger dotts indicate stronger oscillations. The white blank in the mode chart indicates that there is no oscillation observed at the specific frequency for the specific dimension of $z_0'$. Looking up and down the chart, one will find a scattered distribution of dotts for a particular value of $z_0'$. This scattered region indicates spurious oscillations of the resonators and therefore, unwanted oscillation will result. A clear and rather isolated and sole dott which is not accompanied by other weaker dotts indicates a main thickness-shear vibration of the resonator. At the value of $z_0' = 1.8$ mm or less, the ratio of $z_0'/y_0$ being 1.3 or less, in which region the crowded clear dotts are referred by a curve A, the fundamental frequency in the value of approximately 1,180 Hz is observed unchanging in a wide range of dimensional change of $z_0'$. This means that the resonant frequency of AT-cut crystal resonator of this invention does not change almost even if the dimension of $z_0'$ varies at the ratio of $z_0'/y_0$ from 0.1 through 1.3 approximately. B shows where the ratio is 1. C represents where the ratio $z_0'/y_0$ equals to 2 (corresponds to the region of undesired coupling and other overtones of the main resonance shown and described in connection with arrow 21, FIG. 2 of U.S. Pat. No. 3,792,292). D represents such region where $z_0'/y_0$ equals to 0.1. When the ratio becomes smaller than this critical value 0.1, the resonator will be too much thin so that it can not be mass-produced.

Finally, E represents a position corresponding to another one of my sample resonator of different frequency: 4.194304 MHz to be described later.

With the ratio $z_0'/y_0$ becoming larger than 1.3 [corresponding substantially $z_0'$ equal to 2.0 (precisely 1.987)], unwanted spurious mode of vibration will be remarkable so that practically usable resonators can not be provided. Before this invention, no one has ever introduced such mode of vibration as adopted in this invention and therefore no one has ever successfully produced a substantially miniaturized crystal resonator by reducing the dimensional value of $z_0'$.

Profound and labor-consuming experiments contained in the above mode chart and executed at rather lower frequencies only for easy and quicker preparation of the resonators have been executed for the verification of the formula (7) to be described.

The characteristics of the miniaturized AT-cut crystal resonator are summarized as follows:

a. The resonator of the present invention can be miniaturized substantially when compared with conventional resonators. The dimension of the contour $z_0'$ taken along the z-axis of the inventive resonator is set to almost the same order of the dimension of the maximum thickness $y_0$ taken along y-axis. Before this invention, the dimension along the x-axis and that taken along the z-axis of the conventional resonators were set to almost the same as the dimension of the diameter of the ordinary circular convex surface AT-cut crystal resonators, and the dimensions taken along the x-axis or z-axis of such resonators was made usually more than several times of the thickness dimension taken along the y-axis, thereby the size of the resonator of the present invention being amazingly miniaturized. In addition, even when this miniaturization has been brought about, the vibration mode of the resonator does not change essentially in its nature at all, and accordingly, the frequency-temperature characteristics as represented by a cubic or third-order curve suffer from no deterioration, and the value of Q is kept as high as 1,000,000 or more, due to the easily attached efficient supporting means as employed even in such miniaturized design.

b. The resonator of the present invention can be manufactured by slicing a rectangular contoured surface AT-cut mother resonator in parallel to its x-y plane, and accordingly the inventive resonator can be manufactured much easier than the conventional crystal resonators even on the mass production base.

c. The frequency aging which may frequently be invited by the foil-shaped electrodes stuck in the resonator can be improved by putting the electrodes on the sides of the x-y planes of the resonator in the case of this invention, these sides thereof being not directly concerned with the vibration of the resonator and giving no vital effect on the resonance frequency of the thickness-shear vibration.

As a further explanation, the dimension of the contour $z_0'$ of the resonator of this invention is so determined that the electric field intensity along $z_0'$ is sufficiently strong enough to drive such resonator effectively, and also the resonance frequency of such resonator does not depend on the dimension of $z_0'$ and is entirely free from the existence of the electrodes which have been put onto the sides of x-y plane, as shown in FIG. 7.

The foregoing explanation of the present invention can be applied with similar effects not only to the fundamental thickness-shear vibration, but also its overtone vibrations. With respect to the shape of the resonator, the following can be selectively adopted in the present invention:

1. Both chief side surfaces of the resonator are contoured.

2. One of said chief surfaces is flat, while the other is contoured.

Figure 10:
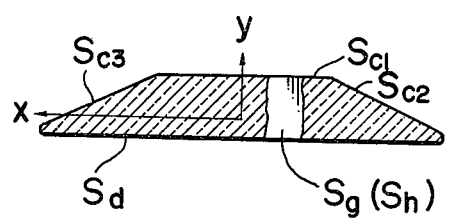

3. Both chief side surfaces are flat and the edges of the contours of the resonator when seen in the direction of the x-axis are wedge-shaped or alternatively so shaped as to represent a single-or double hill configuration, as shown in FIG. 9 or FIG. 10, respectively. These resonator flat configurations may have similar effect as those of the contoured surfaces, when seen from the general gist of the invention.

Naturally, the resonator may have various overall dimensions. A representative example of the dimensions, however, may be as follows, when the resonator has a resonance frequency $f_0 = 4.194304$ MHz of the fundamental thickness-shear mode, yet in the non-limiting sense to the invention.
$x_0 = 4.6$ mm;
$y_0 = 0.477$ mm;
$z'_0 = 0.6$ mm.

The ratio of the dimension taken along the z-axis and the maximum thickness of the resonator, or more specifically $z'_0/y_0$ can be selected as small as a tenth or 0.1, without sacrificing favorable frequency-temperature characteristics.

The mode of the thickness-shear vibration of the rectangular flat surface AT-cut peizoelectric crystal resonator on which this invention is based is indicated mathematically by the following equations:

$$\left.\begin{aligned} u &= U \sin(p\pi x/x_0) \cdot \cos(q\pi y/y_0) \cdot \cos(r\pi z/z_0) \cdot e^{j\omega t} \\ v &= V \cos(p\pi x/x_0) \cdot \sin(q\pi y/y_0) \cdot \cos(r\pi z/z_0) \cdot e^{j\omega t} \\ w &= W \cos(p\pi x/x_0) \cdot \cos(q\pi y/y_0) \cdot \sin(r\pi z/z_0) \cdot e^{j\omega t} \end{aligned}\right\} \quad (1)$$

where u, v and w are instantaneous values of displacements in the directions of x, y and z, respectively; $x_0$, $y_0$ and $z_0$ are specific values of x, y and z as before, respectively, of the resonator; $\omega$ is resonance angular velocity; t represents time; p and q are positive integers of plus sign; r is either zero or a positive integer.

The mode of vibration which is expressed as (p, q, r) will be described as (1, 1, 0) or $p = 1$, $q = 1$, $r = 0$, when it be the main thickness-shear vibration, and as (m, 1, n), or $p = m$, $q = 1$, $r = n$, when it be one of the "inharmonic" thickness-shear vibrations, where m is a positive integer and n is either zero or a positive integer. U, V and W represent respective maximum values of u, v and w.

When the value of q is other than unity or $q \neq 1$, the mode of vibration is defined as the overtone vibration comprising overtone main thickness-shear vibration and its related "inharmonic" thickness-shear vibrations.

According to my analysis, $$U \gg V \text{ or } W \quad (2)$$

therefore, v and w in the equation (1) can be neglected on account of their minor values in comparison with V and W; then the mode of vibration may be represented as follows:

$$u = U \sin(p\pi x/x_0) \cdot \cos(q\pi y/y_0) \cdot \cos(r\pi z/z_0) \cdot e^{j\omega t} \quad (3)$$

With the theoretical and experimental studies by me, the resonance frequency of the equation (3) in this invention may be written as follows:

$$f_{(pqr)} = \frac{q}{2y_0} \sqrt{\frac{c_{66}}{\rho}} \sqrt{1 + \frac{c_{11}}{c_{66}}\left(\frac{p}{q} \cdot \frac{y_0}{x_0}\right)^2 + \frac{c_{55}}{c_{66}}\left(\frac{r}{q} \cdot \frac{y_0}{z_0}\right)^2} \quad (4)$$

where $\rho$ is a density of the piezoelectric crystal resonator or quartz; $c_{55}$ and $c_{66}$ are the characteristic elastic constants of the quartz.

The fundamental thickness-shear vibration may be expressed as (1, 1, 0) when the said vibration is the main mode. Therefore, the equations (3) and (4) can be written as, $$u = U \sin(\pi x/x_0) \cdot \cos(\pi y/y_0) \cdot e^{j\omega t} \quad (5)$$

$$f_{(110)} = \frac{1}{2y_0} \sqrt{\frac{c_{66}}{\rho}} \sqrt{1 + \frac{c_{11}}{c_{66}} \cdot \left(\frac{y_0}{x_0}\right)^2} \quad (6)$$

which means that $f_{(110)}$ is defined primarily by the thickness of the resonator or $y_0$, with a correction to be carried out hereinbelow in the dimension along the electric axis, or $x_0$ dimension, of the resonator.

I have found as a result of my profound experiments in combination with my theoretical consideration that the substantial nature of the thickness-shear vibration of the regular flat surface AT-cut resonator is applicable to the contoured surface AT-cut resonators, provided, however, proper consideration be made on the distribution of the amplitude of vibration on the x-z surfaces of the resonators.

To obtain the equation for the resonance frequency of the main thickness-shear vibration of the contoured surface AT-cut crystal resonator, an equivalent rectangular flat surface AT-cut crystal resonator is considered wherein the dimensions of $y_0$ and $z'_0$ are same as those of the values in the resonator 5 of FIG. 5 and the dimension of $x_0$ is made slightly smaller than that value; or a newly introduced dimension of $x'_0$ is substituted for $x_0$ (refer to equation 6).

Then, the equation (6) can be written with inclusion of all embodiments of the resonator of this invention, as follows:

$$f_{(110)} = \frac{1}{2y_0} \cdot \sqrt{\frac{c_{66}}{\rho}} \cdot \sqrt{1 + \frac{c_{11}}{c_{66}}\left(\frac{y_0}{x'_0}\right)^2} \quad (7)$$

It must be pointed out that the physical dimension taken along the z-axis of the resonator of this invention or $z'_0$ will disappear entirely from the equations (5), (6) and (7); and then the mode of the vibration of this invention becomes entirely free from the value of $z'_0$ of FIG. 3 or FIG. 5.

Before this invention, no one has ever successfully explored of a possibility of the mode of vibration of this invention to such extent of the thin and slim value of $z'_0$. It should be therefore, emphasized again that the physical dimension taken along z-axis of the resonator of this invention can be made very thin with comparison to the thickness of the resonator or up to the ratio of one tenth of the thickness of the resonator.

It will be apparent that various changes such as substitution of equivalents or alternation of the values of the dimensions will occur to those skilled in the art in the practice of this invention in related applications. It is therefore to be understood that the present disclosure is illustrative only, and that such changes in detail are comprehended within the principle of the invention to the full extent indicated by the broad general meaning of the terms in which the appended claims are expressed.

The embodiments of the invention in which an exclusive property or privilege is claimed are as follows:

1. An AT-cut piezoelectric crystal resonator comprising a plurality of contoured surfaces, two of said contoured surfaces being generated by translating contour lines parallel to the z-axis and perpendicular to the electric axis or x-axis, at least one of the said two surfaces being convex, and another two contoured surfaces being perpendicular to said z-axis and spaced apart by a length dimension $z'_0$ which is 0.1 to 1.3, preferably 0.3 to 1.0, of the maximum thickness dimension $y_0$ representing the distance between the first said two surfaces and measured along a line perpendicular to the said x-axis, said resonator being adapted for performing a mode of vibration along the said thickness forming either a fundamental standing wave or an overtone thereof of a thickness-shear vibration, the free ends of said vibration being positioned at the first said two surfaces, the amplitude of vibratory displacements appearing along said x-axis being maximum at the center of each surface of the first said two surfaces, the said center being the midpoint of a length taken along the said x-axis or the dimension $x_0$ which is 3 to 15 of the maximum thickness dimension $y_0$, and constituting the span of arc of the said convex surface, said amplitude becoming null at a point on each of the first said two surfaces where the said point approaches each end of the convex line generating said convex surface, and the distribution of the said amplitude being uniform on any point taken along the said length of the said $z'_0$ dimension on each of the first said two surfaces.

2. An AT-cut piezoelectric crystal resonator, comprising a plurality of contoured surfaces, six of said contoured surfaces being generated by translating contour lines parallel to the z-axis perpendicular to the electric axis or x-axis, two surfaces among the said six surfaces being parallel to each other and parallel to said x-axis, another four surfaces of the said six surfaces being tapered off from each end of the said two surfaces along the said x-axis by forming an opposed pair of wedge-shaped surfaces, another two of said contoured surfaces being perpendicular to said z-axis and spaced apart with a length dimension $z'_0$ which is 0.1 to 1.3, preferably 0.3 to 1.0, of the maximum thickness dimension $y_0$, representing the distance between the first said two surfaces and measured along a line perpendicular to said x-axis, said resonator adapted for performing a mode of vibration along said thickness forming either a fundamental standing wave or an overtone thereof of a thickness-shear vibration, the free ends of said vibration positioned at the first said two surfaces, the amplitude of vibratory displacements appearing along said x-axis being maximum at the center of the physical dimension of said resonator taken along said x-axis, the distribution of said amplitude being entirely uniform on any point taken along the length of said dimension $z'_0$ on each of the first said two surfaces, and said amplitude becoming null at the apexes of said wedge-shaped surfaces.

3. An AT-cut piezoelectric crystal resonator comprising a plurality of contoured surfaces, four of said contoured surfaces being generated by translating contour lines parallel to the z-axis perpendicular to the electric axis or x-axis, two of said four surfaces being parallel to each other and parallel to said x-axis, another two surfaces among the said four surfaces being tapered off from both ends of one of the first said two surfaces so as to represent sloping sections defined by the said four surfaces, said sloping sections being defined in the x-y plane in combination by a longer line of a planar base surface, a shorter line of a planar top surface and two sloping lines, another two of said contoured surfaces being perpendicular to the said z-axis and spaced apart with a length dimension $z'_0$ which is 0.1 to 1.3, preferably 0.3 to 1.0, of the maximum thickness dimension $y_0$ representing the distance between the first said two surfaces and measured along a line perpendicular to said x-axis, said resonator being adapted for performing a mode of vibration along the said thickness forming either a fundamental standing wave or an overtone thereof of a thickness-shear vibration, the free ends of said vibration being positioned at the first said two surfaces, the amplitude of vibratory displacements appearing along said x-axis being maximum at the center of the physical dimension of said resonator taken along said x-axis, the distribution of said amplitude being entirely uniform on any point taken on and along said dimension $z'_0$, on each of the first said two surfaces, and said amplitude becoming null at both ends of the said longer line of the planar base surface.

4. An AT-cut piezoelectric crystal resonator comprising a plurality of contoured surfaces, two of said contoured surfaces being generated by translating contour lines parallel to the z-axis perpendicular to the electric axis or x-axis, another two of said contoured surfaces being perpendicular to said z-axis and spaced apart with a length dimension $z'_0$ which is 0.1 to 1.3 of the maximum thickness dimension $y_0$, representing the distance between the first said two surfaces and measured on and along a line perpendicular to said x-axis, said resonator being adapted for performing a mode of vibration along said thickness in the form of either a fundamental standing wave or an overtone thereof of a thickness-shear vibration, the free ends thereof lying on the first said two surfaces, the distribution of the amplitudes of displacements being uniform at any point taken on and along the length of the dimension $z'_0$ taken on each of the first said two surfaces, and the ratio of the dimensions $z'_0$ to $y_0$ being so determined that the electric field intensity along the said length dimension $z'_0$ is sufficiently strong enough to drive the said resonator effectively.

5. An AT-cut peizoelectric crystal resonator of claim 1, having means to drive the said resonator electrically along the y-axis perpendicular to said electric or x-axis and said z-axis.

6. An AT-cut piezoelectric crystal resonator of claim 2, having means to drive the said resonator electrically along the y-axis perpendicular to said electric or x-axis and said z-axis.

7. An AT-cut piezoelectric crystal resonator of claim 3, having means to drive the said resonator electrically along said y-axis.

8. An AT-cut piezoelectric crystal resonator of claim 4, having means to drive the said resonator electrically along said y-axis.

9. An AT-cut piezoelectric crystal resonator of claim 1, having means to drive the said resonator electrically along said z-axis.

10. An AT-cut piezoelectric crystal resonator of claim 2, having means to drive the said resonator electrically along said z-axis.

11. An AT-cut piezoelectric crystal resonator of claim 3, having means to drive the said resonator electrically along said z-axis.

12. An AT-cut piezoelectric crystal resonator of claim 4, having means to drive the said resonator electrically along said z-axis.

* * * * *